United States Patent
Jin et al.

(10) Patent No.: US 11,755,940 B2
(45) Date of Patent: Sep. 12, 2023

(54) SUPERCONDUCTING CIRCUIT STRUCTURE, SUPERCONDUCTING QUANTUM CHIP AND SUPERCONDUCTING QUANTUM COMPUTER

(71) Applicant: Beijing Baidu Netcom Science and Technology Co., Ltd., Beijing (CN)

(72) Inventors: Lijing Jin, Beijing (CN); Runyao Duan, Beijing (CN)

(73) Assignee: BEIJING BAIDU NETCOM SCIENCE AND TECHNOLOGY CO., L, Beijing (CN)

( * ) Notice: Subject to any disclaimer, the term of this patent is extended or adjusted under 35 U.S.C. 154(b) by 166 days.

(21) Appl. No.: 17/020,527

(22) Filed: Sep. 14, 2020

(65) Prior Publication Data
US 2021/0110290 A1 Apr. 15, 2021

(30) Foreign Application Priority Data
Oct. 11, 2019 (CN) .......................... 201910967230.8

(51) Int. Cl.
*G06N 10/00* (2022.01)
*H10N 60/12* (2023.01)
*H10N 69/00* (2023.01)

(52) U.S. Cl.
CPC .............. *G06N 10/00* (2019.01); *H10N 60/12* (2023.02); *H10N 69/00* (2023.02)

(58) Field of Classification Search
CPC ........ G06N 10/00; G06N 10/40; H01L 27/18; H01L 39/223
See application file for complete search history.

(56) References Cited

U.S. PATENT DOCUMENTS

2020/0272910 A1* 8/2020 Kapit ..................... G06N 10/00

FOREIGN PATENT DOCUMENTS

| CN | 101626233 A | 1/2010 |
|----|-------------|--------|
| CN | 108475353 | 8/2018 |
| CN | 109376867 A | 2/2019 |
| CN | 109784493 | 5/2019 |
| CN | 109840596 | 6/2019 |
| JP | 2010524064 | 7/2010 |

(Continued)

OTHER PUBLICATIONS

IP Australia, Examination Report, Australian Application No. 2020230284, dated Jul. 28, 2021, 6 pages.

(Continued)

*Primary Examiner* — Matthew L Reames
(74) *Attorney, Agent, or Firm* — Norton Rose Fulbright US LLP; James R. Crawford

(57) ABSTRACT

A superconducting circuit structure, a superconducting quantum chip, and a superconducting quantum computer are provided, which relate to the field of quantum computing. The superconducting circuit structure includes: at least two qubits; a connector, coupled with the two qubits respectively, to realize transversal coupling with each of the two qubits; and a coupler, coupled with the two qubits respectively, to realize longitudinal coupling with each of the two qubits. Therefore, the $\sigma_z\sigma_z$ parasitic coupling between the qubits is effectively removed, and a two-qubit gate with high fidelity is obtained.

11 Claims, 2 Drawing Sheets

(56) References Cited

FOREIGN PATENT DOCUMENTS

| JP | 2019508876 | 3/2019 |
|---|---|---|
| WO | WO 2019/126396 | 6/2019 |

OTHER PUBLICATIONS

Richer et al., "Circuit design implementing longitudinal coupling: a scalable scheme for superconducting qubits", JARA Institute for Quantum Information, RWTH Aachen University, Germany, May 3, 2016, pp. 1-10.
Richer et al., "Inductively shunted transmon qubit with tunable transverse and longitudinal coupling", JARA Institute for Quantum Information, RWTH Aachen University, Germany; Physikalisches Institut, Karlsruche Institute of Technology, Germany, Nov. 21, 2017, pp. 1-15.
Richer, "Design of an Inductively Shunted Transmon Qubit with Tunable Transverse and Longitudinal Coupling", RWTH Aachen University, Germany, Apr. 27, 2018, 162 pages.
Versluis et al., "Scalable quantum circuit and control for a superconducting surface code", Netherlands Organisation for Applied Scientific Research (TNO); QuTech, Delft University of Technology; Kavli Institute of Nanoscience, Delft University of Technology; Computer Engineering, Delft University of Technology; Components Research, Intel Corporation; Dec. 28, 2016, pp. 1-9.
Billangeon et al., "Circuit-QED-based scalable architectures for quantum information processing with superconducting qubits", Physical Review B 91, American Physical Society, 2015, pp. 094517-1-094517-31.
SIPO, First Office Action in CN 201910967230.8 dated Sep. 30, 2021.
Search Report in CN 201910967230.8 dated Sep. 30, 2021.

\* cited by examiner

SUPERCONDUCTING CIRCUIT STRUCTURE, SUPERCONDUCTING QUANTUM CHIP AND SUPERCONDUCTING QUANTUM COMPUTER

CROSS-REFERENCE TO RELATED APPLICATION

This application claims priority to Chinese Patent Application No. 201910967230.8, filed on Oct. 11, 2019, which is hereby incorporated by reference in its entirety.

TECHNICAL FIELD

The present application relates to the field of computers, and in particular to the field of quantum computing.

BACKGROUND

In universal quantum computing, implementation of a two-qubit gate with high fidelity is essential. However, as the number of qubits increases, new noise channels and a variety of crosstalks (including but not limited to a crosstalk between qubits, and inevitable parasitic coupling between qubits, etc.) make the implementation of two-qubit gate with high fidelity become a great challenge. When two qubits are connected. $\sigma_x\sigma_x$ coupling that may be used to implement a quantum logic gate will be generated, that is, the quantum states of the two qubits are exchanged by using $\sigma_x\sigma_x$ coupling. Furthermore, additional $\sigma_z\sigma_z$ parasitic coupling will be inevitably generated, that is, the change of the quantum state of one qubit has impact on the other qubit. Obviously, such $\sigma_z\sigma_z$ parasitic coupling will not only directly affect the performance of the qubits, but also limit the fidelity of the two-qubit gate. Therefore, how to eliminate the $\sigma_z\sigma_z$ parasitic coupling between qubits has become an important problem.

SUMMARY

A superconducting circuit structure, a superconducting quantum chip, and a superconducting quantum computer are provided according to embodiments of the present application, which can effectively eliminate the $\sigma_z\sigma_z$ parasitic coupling between qubits, to obtain a two-qubit gate with high fidelity.

In a first aspect, a superconducting circuit structure is provided according to an embodiment of the present application, which includes:
  at least two qubits;
  a connector, coupled with the two qubits respectively, to realize transversal coupling with each of the two qubits; and
  a coupler, coupled with the two qubits respectively, to realize longitudinal coupling with each of the two qubits.

In the embodiments of the present application, on one hand, the $\sigma_z\sigma_z$ parasitic coupling between qubits can be eliminated by adjusting the frequency of the coupler, thereby obtaining a two-qubit gate with high fidelity. On the other hand, due to longitudinal coupling between the coupler and the qubits, the manipulation for the coupler will not affect the qubits. In other words, regulating the frequency of the coupler does not generate a new noise channel. Furthermore, in the longitudinal coupling, since the commutation of the qubit Hamiltonian and the coupling interaction does not have special restriction on the dissipation rate of the coupler, the coupler may be quickly manipulated without affecting the qubits. In other words, in the present application, the speed of manipulating the coupler need not be limited.

Moreover, in the embodiment of the present application, the process of derivation with respect to the $\sigma_z\sigma_z$ coupling between qubits is very concise, and will not be restricted by many approximation conditions, which facilitates understanding and expanding of the scheme.

In an embodiment, the coupler is a resonant cavity, and the resonant cavity includes an adjustable equivalent inductance and a first capacitor connected in parallel with the adjustable equivalent inductance; and
  wherein the adjustable equivalent inductance is configured to realize the longitudinal coupling between the coupler and each of the two qubits.

Here, the magnetic flux passing through the qubit is changed by a magnetic field generated by a current flowing through the adjustable equivalent inductance. For example, if the qubit includes a superconducting quantum interference device, the magnetic flux passing through the superconducting quantum interference device is changed, and the frequency of the qubit is changed in turn, which facilitates the longitudinal coupling between the coupler and the qubit.

In an embodiment, the adjustable equivalent inductance includes a Josephson junction chain, and
  wherein the Josephson junction chain includes at least two Josephson junctions connected in series, and the Josephson junctions in the Josephson junction chain couple the coupler with each of the two qubits, to realize the longitudinal coupling between the coupler and each of the two qubits.

Here, the magnetic flux passing through the qubit is changed by a magnetic field generated by a current flowing through the Josephson junction chain. For example, if the qubit includes a superconducting quantum interference device, the magnetic flux passing through the superconducting quantum interference device is changed, and the frequency of the qubit is changed in turn, which facilitates the longitudinal coupling between the coupler and the qubit.

In an embodiment, the qubit includes a superconducting quantum interference device coupled with the coupler, to realize the longitudinal coupling between the coupler and the qubit.

Here, the magnetic field generated by the current flowing through the Josephson junction chain can change the magnetic flux passing through the superconducting quantum interference device, and the frequency of the qubit is changed in turn, which facilitates the longitudinal coupling between the coupler and the qubit.

In an embodiment, the superconducting quantum interference device includes two Josephson junctions connected in parallel.

In an embodiment, the qubit further includes a noise reduction structure configured to perform noise reduction on a charge fluctuation of an environment where the qubit is located.

In an embodiment, the qubit further includes a second capacitor connected in parallel with the superconducting quantum interference device, and the second capacitor is configured to perform noise reduction on a charge fluctuation of an environment where the qubit is located.

In an embodiment, a qubit network is formed by the superconducting circuit structure including more than two qubits, and wherein
  in the qubit network, the connector is configured to realize coupling between two adjacent qubits; and the coupler is provided between the two adjacent qubits coupled by the connector, and configured to realize the longitudinal coupling with each of the two adjacent qubits.

In the embodiment, the two-qubit structure is extended to a more redundant multi-qubit network structure, thereby more comprehensive functions can be realized.

In an embodiment, the connector includes at least one of following components: a capacitor, a Josephson junction and a resonance circuit.

Here, in order to make the two qubits effectively coupled, the connector includes at least one of: a capacitor, a Josephson junction, and a resonant circuit.

In a second aspect, a superconducting quantum chip is provided according to an embodiment of the present application, on which at least a superconducting circuit structure is formed, wherein the superconducting circuit structure includes:

at least two qubits;
a connector, coupled with the two qubits respectively, to realize transversal coupling with each of the two qubits; and
a coupler, coupled with the two qubits respectively, to realize longitudinal coupling with each of the two qubits.

In a third aspect, a superconducting quantum computer is provided according to an embodiment of the present application, in which at least a superconducting quantum chip and a manipulation and reading device connected to the superconducting quantum chip are provided, wherein the superconducting circuit structure includes:

at least two qubits;
a connector, coupled with the two qubits respectively, to realize transversal coupling with each of the two qubits; and
a coupler, coupled with the two qubits respectively, to realize longitudinal coupling with each of the two qubits.

One embodiment of the present application has advantages or beneficial effects as follows.

On one hand, the $\sigma_z \sigma_z$ parasitic coupling between qubits can be eliminated by adjusting the frequency of the coupler, thereby a two-qubit gate with high fidelity is obtained. On the other hand, due to longitudinal coupling between the coupler and the qubit, the manipulation for the coupler will not affect the qubit. In other words, regulating the frequency of the coupler does not generate a new noise channel. Furthermore, in longitudinal coupling, the commutation of the qubit Hamiltonian and the coupling interaction does not have special restriction on the dissipation rate of the coupler, the coupler can be quickly manipulated without affecting the qubits. In other words, in the present application, the speed of manipulating the coupler need not be limited.

Moreover, in the embodiments of the present application, the process of derivation with respect to the $\sigma_z \sigma_z$ coupling between qubits is very concise, and will not be restricted by many approximation conditions, which facilitates understanding and expanding of the scheme.

Other effects of the foregoing optional schemes will be described below with reference to specific embodiments.

BRIEF DESCRIPTION OF THE DRAWINGS

The drawings are only for better understanding, rather than limiting the present application, in which.

DETAILED DESCRIPTION OF THE EMBODIMENTS

Figure 1:
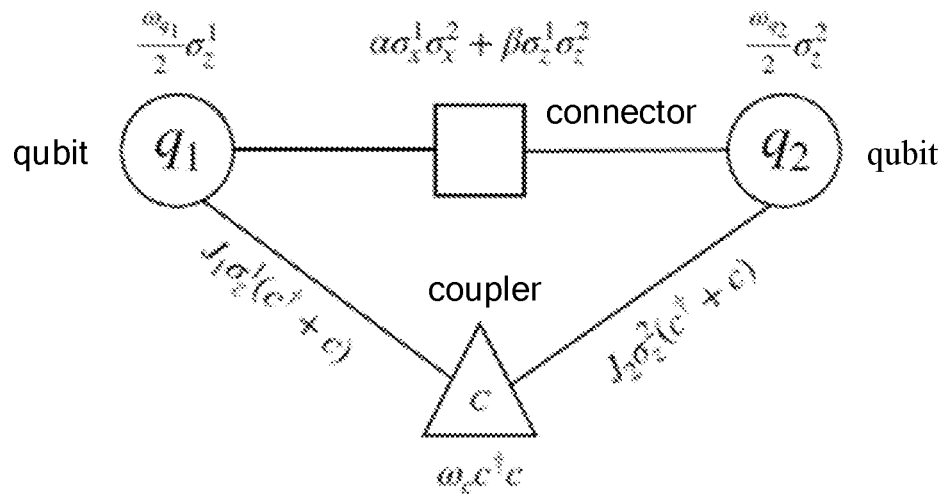
FIG. 1 is a schematic diagram of the superconducting circuit structure according to an embodiment of the present application.

The exemplary embodiments of the present application will be described below in combination with the drawings, including various details of the embodiments of the present application to facilitate understanding, which should be considered only exemplary. Therefore, those ordinary skilled in the art should realize that various changes and modifications can be made to the embodiments described herein without departing from the scope and spirit of the present application. Similarly, for clarity and simplicity, the following description omits the description of the known functions and structures.

In practice, in order to eliminate $\sigma_z \sigma_z$ parasitic coupling between qubits, a coupler can be introduced between two qubits. The coupler may be a qubit with an adjustable frequency, and the coupling between the coupler and the bits is transversal, i.e., the transversal coupling. The core principle is that the introduction of a coupler means creating a new coupling path between qubits, such that additional effective $\sigma_x \sigma_x$ coupling and $\sigma_z \sigma_z$ coupling are generated between the qubits, and the coupling strength can be adjusted by changing the frequency of the coupler. Here, if the frequency of the coupler is set to be a certain value, the $\sigma_z \sigma_z$ coupling generated by the coupler will cancel the $\sigma_z \sigma_z$ parasitic coupling existing between the qubits themselves. In this way, the $\sigma_z \sigma_z$ parasitic coupling can be eliminated, thereby the fidelity of the two-qubit gate is improved.

It should be noted that in the above process, there exists dispersive coupling between the qubit and the coupler, that is, the coupling strength between the qubit and the coupler needs to be much smaller than the difference between their frequencies. A main goal of using dispersive coupling herein is to protect the qubits to the greatest extent and reduce the influence of the noise channel of the coupler on the qubits.

Although the above scheme can eliminate $\sigma_z \sigma_z$ parasitic coupling between qubits, there still exist disadvantages as follows.

Firstly, although the $\sigma_z \sigma_z$ parasitic coupling is eliminated by introducing the coupler, additional noise is introduced, due to transversal coupling between the qubit and the coupler. According to Purcell effect, the manipulation for the coupler will inevitably cause a back action to the qubits, which introduces additional noises and affects the performance of the qubits, causing it impossible to implement a two-qubit gate with high-fidelity.

Secondly, in order to make the back action caused by the coupler to the qubits as small as possible, it is required that the coupling of the coupler and the manipulation device cannot be too large. Therefore, the speed of manipulating the coupler is limited.

Thirdly, due to transversal coupling between the qubit and the coupler, the influence of the introduction of the coupler on the entire structure is not local. Thus, it is impossible to easily extend the scheme of two-qubit circuit to a multi-qubit network.

Fourthly, since the theoretical analysis and derivation for the transversal coupling are relatively cumbersome, the fourth-order perturbation theory is required to deal with the non-linear terms in circuit Hamiltonian. In this way, the entire process of derivation is very complicated, and some approximation conditions are needed, which is negative to understand and expand the scheme.

In view of this, in order to efficiently eliminate the $\sigma_z\sigma_z$ parasitic coupling between qubits, implement a two-qubit gate with high fidelity and avoid the above problems, a superconducting circuit structure is provided according to the embodiment the present application, in which there exists longitudinal coupling between the qubits and the coupler. Therefore, by adjusting the frequency of the coupler, the $\sigma_z\sigma_z$ parasitic coupling between the qubits can be eliminated, a two-qubit gate with high fidelity is obtained, and the above problems are avoided.

It should be noted herein that the superconducting circuit structure in the embodiments of the present application refers to a circuit implemented by using a superconducting device, that is, the components used in the superconducting circuit structure are made of superconducting materials.

Figure 2:
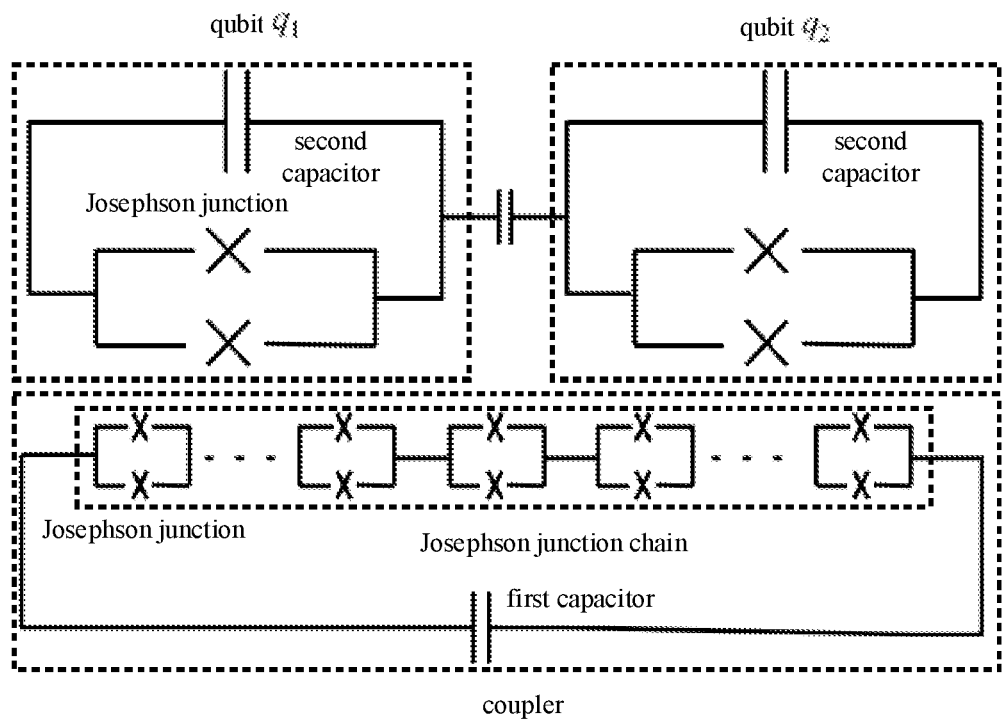
FIG. 2 is a schematic diagram of the superconducting circuit structure in a specific example according to an embodiment of the present application.

Specifically, FIG. 1 illustrates a schematic diagram of a superconducting circuit structure according to an embodiment of the present application, FIG. 2 illustrates a schematic diagram of a superconducting circuit structure in a specific example according to an embodiment of the present application. The superconducting circuit structure includes:

at least two qubits, as shown in FIG. 1, including at least qubits $q_1$ and $q_2$;

a connector, coupled with the two qubits respectively, to realize transversal coupling with each of the two qubits, as shown in FIG. 1, the connector is transversally coupled with the qubits $q_1$ and $q_2$ respectively, and the qubits $q_1$ and q: are coupled via the connector; and a coupler, coupled with the two qubits respectively, to realize longitudinal coupling with each of the two qubits, as shown in FIG. 1, the coupler c is coupled with the qubits $q_1$ and $q_2$ respectively, to realize longitudinal coupling between the coupler and qubits.

In the embodiments of the present application, on one hand, the $\sigma_z\sigma_z$ parasitic coupling between qubits can be eliminated by adjusting the frequency of the coupler, thereby a two-qubit gate with high fidelity is obtained. On the other hand, due to longitudinal coupling between the coupler and qubits, the manipulation for the coupler will not affect the qubit. In other words, regulating the frequency of the coupler does not generate a new noise channel. Furthermore, in longitudinal coupling, since the commutation of qubit Hamiltonian and the coupling interaction does not have special restriction on the dissipation rate of the coupler, the coupler can be quickly manipulated without affecting the qubits. In other words, in the present application, the speed of manipulating the coupler need not be limited.

Moreover, in the embodiments of the present application, the derivation with respect to the $\sigma_z\sigma_z$ coupling between the qubits is very concise, and will not be restricted by many approximation conditions, which facilitates understanding and expanding of the solution.

In a specific example, the connector includes at least one of: a capacitor, a Josephson junction, and a resonant circuit, so that the two qubits are effectively coupled. It should be noted that the resonant circuit may be particularly the same circuit as that of the resonant cavity in the present application, or may be other resonant circuits, which is not limited in the present application.

In a specific example, the coupler is a resonant cavity, such as an LC resonant cavity. Furthermore, the resonant cavity includes: an adjustable equivalent inductance, and a first capacitor connected in parallel with the adjustable equivalent inductance. The adjustable equivalent inductance is configured to realize the longitudinal coupling between the coupler and each of the two qubits.

In the embodiment, the magnetic flux passing through the qubit is changed by a magnetic field generated by a current flowing through the adjustable equivalent inductance. For example, if the qubit includes a superconducting quantum interference device, the magnetic flux passing through the superconducting quantum interference device is changed, and the frequency of the qubit is changed in turn, which facilitates the longitudinal coupling between the coupler and the qubit.

In a specific example, as shown in FIG. 2, the adjustable equivalent inductance includes a Josephson junction chain, wherein the Josephson junction chain includes at least two Josephson junctions connected in series, and the Josephson junctions in the Josephson junction chain couple the coupler with each of the two qubits, to realize the longitudinal coupling between the coupler and each of the two qubits.

In the embodiment, the magnetic flux passing through the qubit is changed by a magnetic field generated by a current flowing through the Josephson junction chain. For example, if the qubit includes a superconducting quantum interference device, the magnetic flux passing through the superconducting quantum interference device is changed, the frequency of the qubit is changed in turn, which facilitates the longitudinal coupling between the coupler and the qubit.

In a specific example, the qubit includes a superconducting quantum interference device. The superconducting quantum interference device is coupled with the resonant cavity, to realize the longitudinal coupling between the coupler and the qubit. For example, as shown in FIG. 2, a superconducting quantum interference device includes two Josephson junctions connected in parallel.

In a specific example, the qubit also includes a noise reduction structure configured to perform noise reduction on a charge fluctuation of the environment where the qubit is located. For example, the noise reduction structure is a capacitor, as shown in FIG. 2.

The qubit also includes a second capacitor connected in parallel with the superconducting quantum interference device, and the second capacitor is configured to perform noise reduction on a charge fluctuation of an environment where the qubit is located.

Figure 3:
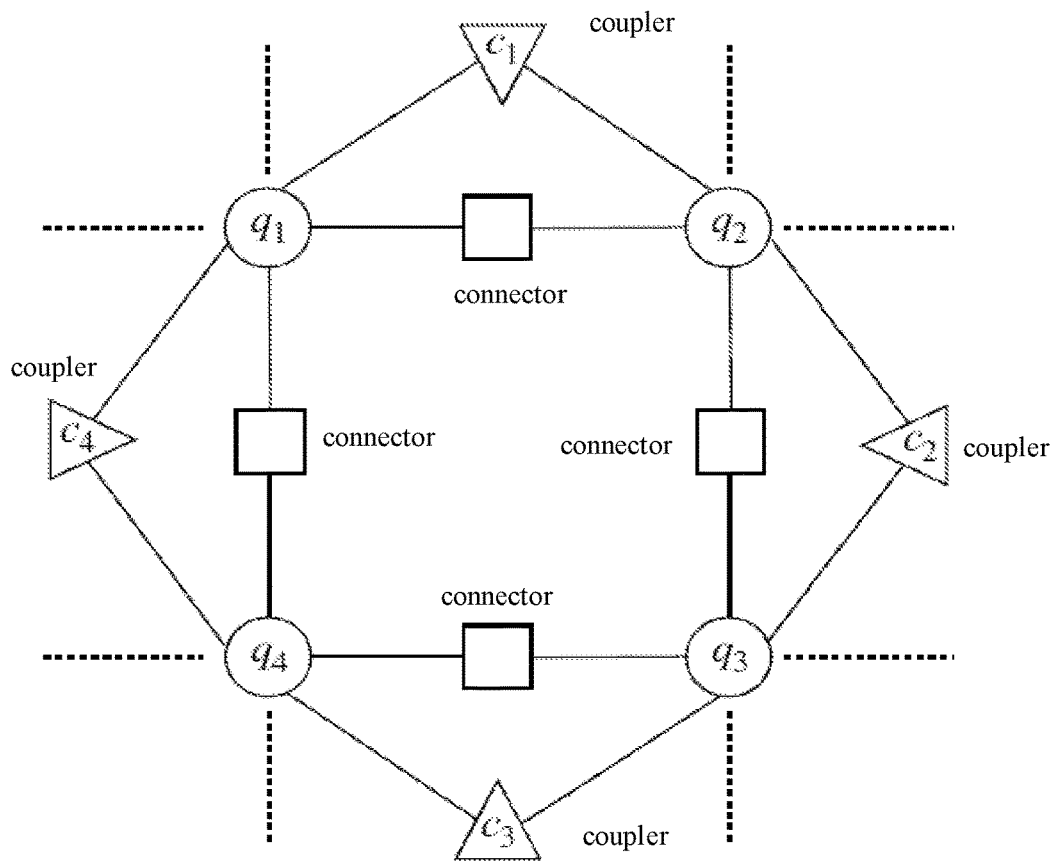
FIG. 3 is a schematic structural diagram of a qubit network according to an embodiment of the present application.
Figure 4:
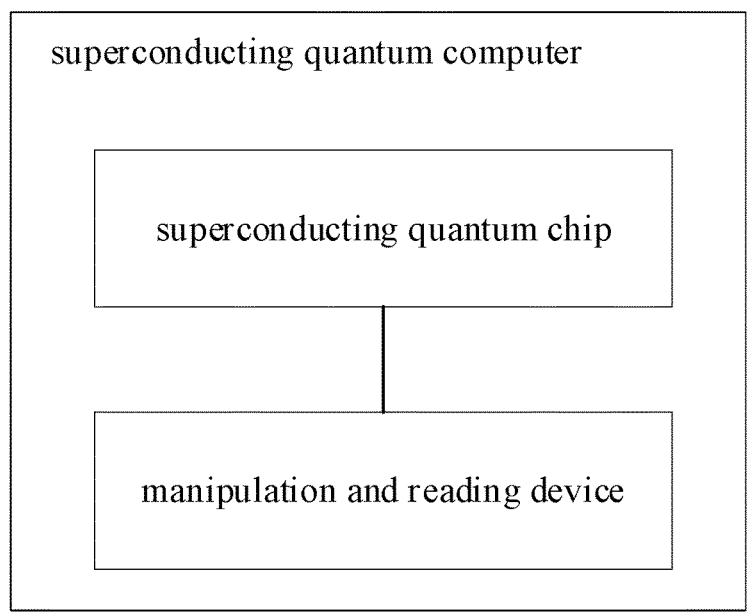
FIG. 4 is a schematic of an exemplary superconducting quantum computer.

In a specific example, a qubit network is formed by the superconducting circuit structure including more than two qubits, wherein in the qubit network, the connector is configured to realize coupling between two adjacent qubits; and the coupler is provided between the two adjacent qubits coupled by the connector, and configured to realize the longitudinal coupling with each of the two adjacent qubits. For example, as shown in FIG. 3, adjacent qubits $q_1$ and $q_2$ are connected by a connector, and a coupler $c_1$ is provided between adjacent qubits $q_1$ and $q_2$, and the coupler $c_1$ realizes the longitudinal coupling with each of the adjacent qubits $q_1$ and $q_2$. Adjacent qubits $q_1$ and $q_4$ are connected by a connector, and a coupler $c_4$ is provided between adjacent qubits $q_1$ and $q_4$, and the coupler $c_4$ realizes the longitudinal coupling with each of the adjacent qubits $q_1$ and $q_4$. Similarly, a coupler $c_2$ is provided between adjacent qubits $q_2$ and $q_3$, and a coupler $c_3$ is provided between adjacent qubits $q_3$ and $q_4$.

Obviously, the embodiment of the present application can be easily extended to a multi-qubit network structure. Moreover, due to longitudinal coupling between the coupler and the qubits, the introduction of the coupler between the qubits will not affect other components of the entire circuit. In other words, the effect caused by the coupler is local. In view of this, the two-qubit structure can be simply extended as a module.

It should be noted that the qubits in the embodiments of the present application can also be implemented by other types of structures with a superconducting quantum interference device, such as a Cooper pair box structure. This is not limited in the present application, as long as there exists longitudinal coupling between the qubit and the resonant cavity. Furthermore, the coupler in an embodiment of the present application may be a resonant cavity or other devices, which is not limited in this application, as long as the coupler can realize the longitudinal coupling with the qubit.

In this way, on one hand, by adjusting the frequency of the coupler, the $\sigma_z\sigma_z$ parasitic coupling between the qubits can be eliminated, thereby a two-qubit gate with high fidelity is obtained. On the other hand, due to longitudinal coupling between the coupler and the qubit, the manipulation for the coupler will not affect the qubit. In other words, regulating the frequency of the coupler does not generate a new noise channel. Furthermore, in longitudinal coupling, since the commutation of the qubit Hamiltonian and the coupling interaction does not have special restriction on the dissipation rate of the coupler, the coupler can be quickly manipulated without affecting the qubits. In other words, in the embodiment of the present application, the speed of manipulating the coupler need not be limited.

Moreover, in the embodiment of the present application, the process of derivation with respect to the $\sigma_z\sigma_z$ coupling between qubits is very concise, and will not be restricted by many approximation conditions, which facilitates understanding and expanding of the solution.

Hereinafter, the present application will be further described in details with reference to some embodiments. Specifically, the technical solutions of the present application will be described in three parts. In the first part, the design idea and scheme of a two-qubit gate with high-fidelity are introduced, and the physical principle therein is analyzed. In the second part, based on the first part, the scheme of implementing a superconducting circuit is designed. In the third part, the two-qubit scheme in the first part is extended to a more abundant structure of multi-qubit network.

Specifically, in the first part, the scheme of a two-qubit gate with high fidelity is as follows.

In an experiment of superconducting circuit, two qubits, such as $q_1$ and $q_2$ as shown in FIG. 1, are connected by a capacitor, where $q_1$ and $q_2$ may be described by Pauli operators $\sigma_z^1$, $\sigma_z^2$; and the capacitor can be replaced with a Josephson junction or a resonant cavity, indicated by a box shown in FIG. 1. Some parasitic coupling, such as $\sigma_z^1\sigma_z^2$ coupling, is often generated concomitantly in addition to $\sigma_x^1\sigma_x^2$ coupling between qubits. In order to eliminate the parasitic coupling, a coupler c (indicated by a triangle shown in FIG. 1) is introduced. It is should be emphasized that the coupling between the coupler c and the two qubits is longitudinal coupling, that is, the interaction is $\sigma_z(c^\dagger+c)$. Therefore, the $\sigma_z\sigma_z$ parasitic coupling between qubits can be eliminated by adjusting the frequency of the coupler. In the experiment, the coupler can be an LC resonant cavity. Then, by adjusting the frequency of the coupler, the $\sigma_z\sigma_z$ parasitic coupling can be eliminated, and a two-qubit gate with higher fidelity can be obtained.

In order to clearly explain the principle of the application and understand the scheme shown in FIG. 1, the Hamiltonian of the superconducting circuit structure is given as:

$$H = \frac{\omega_{q_1}}{2}\sigma_z^1 + \frac{\omega_{q_2}}{2}\sigma_z^2 + \alpha\sigma_x^1\sigma_x^2 + \beta\sigma_z^1\sigma_z^2 + \omega_c c^\dagger c + J_1\sigma_z^1(c^\dagger + c) + J_2\sigma_z^2(c^\dagger + c). \quad (1)$$

In the equation (1) above, the first four terms represent two qubits and their two different types of interactions: $\sigma_x^1\sigma_x^2$ coupling and $\sigma_z^1\sigma_z^2$ coupling, wherein $\alpha$, $\beta$ represent the strength of the coupling, both of which are positive. The fifth term describes the resonant cavity, where $c^\dagger$, c are the corresponding shift operators, and the last two terms characterize the longitudinal coupling between the coupler and the qubits.

Next, the Schrieffer-Wolff transformation is performed on the equation in order to obtain a new effective coupling generated between the qubits after the coupler is introduced. Specifically, the following equation is used:

$$H_{eff} = e^{-s}He^s = H + [H, s] + \frac{1}{2!}[[H, s], s] + \frac{1}{3!}[[[H, s], ], s] + \ldots \quad (2)$$

In the equation (2), "s" may be described as:

$$s = \chi_1\sigma_z^1(c^\dagger - c) + \chi_2\sigma_z^2(c^\dagger - c) \quad (3).$$

In the equation (3), $\chi_1$, $\chi_2$ are undetermined real numbers. Next, each term in the equation (2) is calculated in turn. In an experiment of a superconducting circuit, the conditions $J_1$, $J_2$, $\omega_c \gg \alpha$, $\beta$ can be achieved, based on which, the following equation can be obtained:

$$[H,s] = \omega_c\chi_1\sigma_z^1(c^\dagger+c) + \omega_c\chi_2\sigma_z^2(c^\dagger+c) + 2(J_1\chi_2+J_2\chi_1)\sigma_z^1\sigma_z^2 + 2J_1\chi_1 + 2J_2\chi_2 \quad (4).$$

In the equation (4), strictly speaking, there should be some additional terms, such as $\sigma_x^1\sigma_y^2(c^\dagger-c)$ and $\sigma_y^1\sigma_x^2(c^\dagger-c)$. However, since the coefficients of them are very small (since $J_1$, $J_2$, $\omega_c \gg \alpha$, $\beta$), they can be ignored. Furthermore, the following equation can be obtained:

$$[[H,s],s] = 4\omega_c\chi_1\chi_2\sigma_z^1\sigma_z^2 + 2\omega_c(\chi_1\chi_1+\chi_2\chi_2) \quad (5).$$

$$[[[H,s],s],s] = 0 \quad (6).$$

Substituting the equations (4)-(6) into the equation (2), the following equation can be obtained:

$$H_{eff} = \qquad (7)$$
$$\frac{\omega_{q_1}}{2}\sigma_z^1 + \frac{\omega_{q_2}}{2}\sigma_z^2 + (J_1 + \omega_c\chi_1)\sigma_z^1(c^\dagger + c) + (J_2 + \omega_c\chi_2)\sigma_z^2(c^\dagger + c) + \alpha\sigma_x^1\sigma_x^2 + (\beta + 2J_1\chi_2 + 2J_2\chi_1 + 2\omega_c\chi_1\chi_2)\sigma_z^1\sigma_z^2 + \omega_c c^\dagger c + 2J_1\chi_1 + 2J_2\chi_2 + \omega_c(\chi_1\chi_1 + \chi_2\chi_2).$$

Assuming $\chi_1 = J_1/\omega_c$ and $\chi_2 = J_2/\omega_c$, the equation (7) is transformed to be:

$$H_{eff} = \frac{\omega_{q_1}}{2}\sigma_z^1 + \frac{\omega_{q_2}}{2}\sigma_z^2 + \alpha\sigma_x^1\sigma_x^2 + \qquad (8)$$

-continued $$\left(\beta - 2\frac{J_1 J_2}{\omega_c}\right)\sigma_z^1 \sigma_z^2 + \omega_c c^\dagger c - \frac{(J_1)^2 + (J_2)^2}{\omega_c}.$$

It can be seen that by the Schrieffer-Wolff transformation, the interaction between the qubits and the coupler (that is, the last two terms in the equation (1)) can be eliminated, and an effective $\sigma_z\sigma_z$ coupling between the qubits is generated instead. By comparing the equations (1) and (8), it can be found that $\sigma_z\sigma_z$ coupling is generated after the coupler longitudinally coupled with the qubits is introduced. When the frequency of the coupler is adjusted so that $2J_1J_2/\omega_c=\beta$, the $\sigma_z\sigma_z$ parasitic coupling existing between the qubits themselves can be eliminated. Here, the last term in the equation (8) is a constant term.

As shown in formula (8), when the $\sigma_z\sigma_z$ parasitic coupling is eliminated, only $\sigma_x\sigma_x$ coupling is left between the qubits, which can be directly used to implement a two-qubit iSWAP gate. Specifically, by adjusting the frequencies of the two qubits to make them resonate, that is, $\omega_{q_1}=\omega_{q_2}$, and by representation transform, the first two terms in (8) are rotated away to obtain a new systemic effective Hamiltonian $\alpha(\sigma_+^1\sigma_-^2+\sigma_-^1\sigma_+^2)$, where $\sigma_\pm^{1,2}=(\sigma_x\pm i\sigma_y)/2$ is the corresponding Pauli shift operator. Then, the system dynamics is caused to evolve for a period of time t, and the evolution operator U of the system is:

$$U(t)=e^{-i\alpha(\sigma_+^1\sigma_-^2+\sigma_-^1\sigma_+^2)t} \qquad (9).$$

The equation (9) is transformed into a matrix form:

$$U(t) = \begin{pmatrix} 1 & 0 & 0 & 0 \\ 0 & \cos(\alpha t) & -i\sin(\alpha t) & 0 \\ 0 & -i\sin(\alpha t) & \cos(\alpha t) & 0 \\ 0 & 0 & 0 & 1 \end{pmatrix} \equiv iSWAP. \qquad (10)$$

When the evolution period $t=\pi/(2\alpha)$, an iSWAP gate can be obtained. Additionally, when the evolution period $t=\pi/(4\alpha)$, a $\sqrt{iSWAP}$ gate can be obtained. Since the systemic $\sigma_z\sigma_z$ parasitic coupling has been eliminated, the fidelity of the iSWAP gate or $\sqrt{iSWAP}$ gate will be improved. Furthermore, the iSWAP gate or $\sqrt{iSWAP}$ gate can be combined with a single-bit revolving gate to form a group of universal qubit gates for quantum computing.

In fact, in addition to eliminating the $\sigma_z\sigma_z$ parasitic coupling between qubits, the scheme of the application has other advantages as follows.

First of all, as a comparison, if a transversal coupling (i.e., $\sigma_x(c^\dagger+c)$) is adopted, a new noise channel will be introduced. According to the Purcell effect, it will undoubtedly affect the fidelity of the two-qubit gate. In the present application, since the coupling between the coupler and the qubits is longitudinal coupling (that is, $\sigma_z(c^\dagger+c)$), the manipulation for the coupler will not affect the qubit, in other words, and the adjusting of the frequency of the coupler does not generate a new noise channel.

Secondly, in the present application, the frequency of the coupler can be quickly manipulated. Compared with the adoption of transversal coupling, in view that the qubit cannot be affected by the reaction of the coupler too much, the coupling strength of the coupler and the environment cannot be too strong, and a scheme limiting the speed of manipulation is required. In the present application, in longitudinal coupling, since the commutation of the qubit Hamiltonian and the coupling interaction does not have special restrictions on the dissipation rate of the coupler, the coupler can be quickly manipulated without affecting the qubit.

Finally, based on the scheme provided by the present application, the derivation with respect to $\sigma_z\sigma_z$ coupling between qubits is very concise, and it will not be restricted by many approximation conditions.

In the second part, the scheme of a superconducting circuit of the two-qubit gate with high fidelity is described as follows.

As shown in FIG. 2, the two qubits are coupled together through a capacitor. Of course, the capacitor here can also be a Josephson junction (similar to Google's Gmon scheme) or a resonant cavity. In short, the purpose is to make the two qubits be coupled effectively. The qubit here can be a transmon qubit, which is composed of a superconducting quantum interference device (also known as SQUID including two Josephson junctions connected in parallel) and a capacitor connected in parallel. Ideally, there will be $\sigma_x\sigma_x$ coupling between qubits, but in practice (in an experiment of a superconducting circuit), $\sigma_z\sigma_z$ parasitic coupling is often generated concomitantly. To eliminate the $\sigma_z\sigma_z$ parasitic coupling, a coupler is introduced, which includes a Josephson junction chain (consisting of a series of Josephson junctions in series, which can be equivalent to an adjustable inductor as a whole) and a capacitor. The Josephson junction chain and the capacitor are connected in parallel to form an equivalent LC resonant cavity. It should be emphasized that the adjustable equivalent inductance is coupled with the superconducting quantum interference devices in the qubits, respectively. The principle therein is that the magnetic field generated by the current flowing through the equivalent inductance will change the magnetic flux passing through the superconducting quantum interference device, and the frequency of the qubit is changed in turn. By such a design, a longitudinal coupling can be generated between the qubit and the coupler, that is, $\sigma_z(c^\dagger+c)$.

FIG. 2 is a particular superconducting circuit structure designed based on the idea and structure shown in FIG. 1. As shown in FIG. 2, firstly, the qubit consists of a superconducting quantum interference device (also known as SQUID) and a capacitor connected in parallel, and the qubits are connected by a capacitor (or a Josephson junction or a resonant cavity). The coupler includes an LC resonant cavity, which consists of a Josephson junction chain (equivalent to an adjustable inductor) and a capacitor connected in parallel. By changing the magnetic flux passing through the Josephson junction chain, the frequency of the coupler may be adjusted. Additionally, the magnetic field generated by the adjustable equivalent inductance passes through the qubit superconducting quantum interference device of the qubit, to realize the longitudinal coupling between the coupler and the qubit.

Furthermore, the Hamiltonian corresponding to the superconducting circuit structure in FIG. 2 is given, which obviously describes exactly the Hamiltonian in the equation (1). Here, the qubit shown in FIG. 2 adopts the transmon qubit which is relatively mature currently. Taking $q_1$ as an example, its Hamiltonian may be described as $\omega_{q_1}a_1^\dagger a_1-(\alpha_1/2)a_1^\dagger a_1^\dagger a_1 a_1$, where $\omega_{q_1}$ is the frequency of a qubit, and $a_1^\dagger$, $a_1$ is a shift operator satisfying $[a_1, a_1^\dagger]=1$, and $\alpha_1$ represents the degree of non-linearity. Similarly, the circuit Hamiltonian describing the qubit $q_2$ is $\omega_{q_2}a_2^\dagger a_2-(\alpha_2/2)a_2^\dagger a_2^\dagger a_2 a_2$, where $[a_2, a_2^\dagger]=1$. Additionally, as discussed above, besides a normal transversal coupling $\alpha(a_1^\dagger+a_1)(a_2^\dagger+a_2)$ generated between the two qubits, the higher energy levels of the transmon qubits also induce parasitic longitudinal coupling, $\beta a_1^\dagger a_1 a_2^\dagger a_2$, where $\alpha$ and $\beta$ represent the strength of the coupling. A coupler is introduced (such as by using a resonant cavity, that is, $\omega_c c^\dagger c$) here. The interaction between the resonant cavity and the qubit is longitudinal coupling, that is, $J_1 a_1^\dagger a_1 (c^\dagger + c)$ and $J_2 a_2^\dagger a_2 (c^\dagger + c)$. Furthermore, by collecting the items, a Hamiltonian describing the superconducting circuit structure shown in FIG. 2 is obtained:

$$\tilde{H} = \omega_{q_1} a_1^\dagger a_1 - (\alpha_1/2) a_1^\dagger a_1^\dagger a_1 a_1 + \omega_{q_2} a_2^\dagger a_2 - (\alpha_2/2) a_2^\dagger a_2^\dagger a_2 a_2 + \alpha(a_1^\dagger + a_1)(a_2^\dagger + a_2) + \beta a_1^\dagger a_1 a_2^\dagger a_2 + \omega_c c^\dagger c + J_1 a_1^\dagger a_1 (c^\dagger + c) + J_2 a_2^\dagger a_2 (c^\dagger + c) \quad (4).$$

Then, the infinite-dimensional Hilbert space (corresponding to the operator $a_{1,2}^\dagger$, $a_{1,2}$) representing the non-linear resonant cavity is degraded into a two-dimensional space (corresponding to the Pauli shift operator $\sigma_+^{1,2}$, $\sigma_-^{1,2}$) representing the qubit, the equation (1) is obtained.

Based on the analysis in the "first part", by using the superconducting circuit structure, high fidelity can be achieved, and the two-qubit gate of the coupler can be quickly adjusted. As for the "first part", by adjusting the frequencies of two qubits to make them resonate, namely $\omega_{q_1} = \omega_{q_2}$, the system dynamics is caused to evolve for a period of time $t = \pi/(2\alpha)$, so an iSWAP gate can be obtained. Additionally, when the evolution period $t = \pi/(4\alpha)$, a $\sqrt{\text{iSWAP}}$ gate can be obtained. Since the systemic $\sigma_z \sigma_z$ parasitic coupling has been eliminated, the fidelity of the iSWAP gate or $\sqrt{\text{iSWAP}}$ gate can be improved. Furthermore, by combining the iSWAP gate or $\sqrt{\text{iSWAP}}$ gate with a single-bit revolving gate to form a group of universal qubit gates for quantum computing.

In the third part, a two-qubit gate with high fidelity is implemented in a multi-qubit network structure.

The technical solution provided in the present application may be not only used in a two-qubit structure, in fact, it may also be extended to a more redundant multi-qubit network structure, thereby more comprehensive functions are acquired. As shown in FIG. 3, the scheme and ideas described in FIG. 1 are extended to a multi-qubit network structure. Here, for the sake of simplicity, only four qubits are shown in the figure (the dashed lines in the figure indicate that they can be naturally extended in the two-dimensional plane). Firstly, every two qubits are connected together by a capacitor, a Josephson junction or a resonant cavity (indicated by the box shown in FIG. 3). Secondly, between every two adjacent qubits, a coupler (indicated by the triangle shown in FIG. 3) longitudinally coupled with the qubits is introduced. In this way, a qubit network is formed, and the principle thereof is similar to the aforementioned circuit with two qubits. The introduction of the coupler makes the parasitic $\sigma_z \sigma_z$ coupling existing between the qubits eliminated, thereby the fidelity of the two-qubit gate is improved. The advantages shown in the aforementioned circuit with two qubits still work here.

While considering the qubit network, another advantage of the solution (i.e., the longitudinal coupling between the coupler and the qubits) of the present application will be found. That is, due to the commutation of the qubit Hamiltonian and the interaction between the coupler and the qubit, the manipulation for the coupler does not affect the qubits longitudinally coupled therewith, and does not affect the entire network structure, when the coupler is manipulated.

In a word, the advantages of this application are summarized as follows.

Firstly, due to the adoption of longitudinal coupling (between the coupler and the qubits), the manipulation for the coupler does not have an adverse effect on the qubit, to affect the performance of the qubit. This is a very beneficial enhancement for further improving the fidelity of a two-qubit gate.

Secondly, also due to the adoption of longitudinal coupling (between the coupler and the qubits), in the present application, there is no particular restrictions on the coupling between the coupler and the external manipulation device. Therefore, the speed of manipulating the coupler is not particularly limited, and in the present application, quick manipulation for the coupler is allowed.

Thirdly, the scheme of the present application can be easily extended to a qubit network structure. Due to the adoption of longitudinal coupling between the coupler and the qubits, the introduction of the coupler between the qubits will not affect the other components in the circuit. In other words, the effect of the coupler is local. In view of this, the two-qubit structure can be extended as a module.

Fourthly, the principle of eliminating the $\sigma_z \sigma_z$ parasitic coupling in the present application is very simple, and the process of derivation and the result are also very concise and clear.

A superconducting quantum chip is provided according to an embodiment of the present application, on which at least a superconducting circuit structure is formed, wherein the superconducting circuit structure includes:
 at least two qubits;
 a connector, coupled with the two qubits respectively, to realize transversal coupling with each of the two qubits; and
 a coupler, coupled with the two qubits respectively, to realize longitudinal coupling with each of the two qubits.

In a specific example, the coupler is a resonant cavity, and the resonant cavity includes an adjustable equivalent inductance and a first capacitor connected in parallel with the adjustable equivalent inductance, wherein
 the adjustable equivalent inductance is configured to realize the longitudinal coupling between the coupler and each of the two qubits.

In a specific example, the adjustable equivalent inductance includes a Josephson junction chain, wherein
 the Josephson junction chain includes at least two Josephson junctions connected in series, and the Josephson junctions in the Josephson junction chain couple the coupler with each of the two qubits, to realize the longitudinal coupling between the coupler and each of the two qubits.

In a specific example, the qubit includes a superconducting quantum interference device coupled with the coupler, to realize the longitudinal coupling between the coupler and the qubit.

In a specific example, the superconducting quantum interference device includes two Josephson junctions connected in parallel.

In a specific example, the qubit further includes a noise reduction structure configured to perform noise reduction on a charge fluctuation of an environment where the qubit is located.

In a specific example, the qubit further includes a second capacitor connected in parallel with the superconducting quantum interference device, and the second capacitor is configured to perform noise reduction on a charge fluctuation of an environment where the qubit is located.

In a specific example, a qubit network is formed by the superconducting circuit structure including more than two qubits, wherein
 in the qubit network, the connector is configured to realize coupling between two adjacent qubits; and the coupler is provided between the two adjacent qubits coupled by the connector, and configured to realize the longitudinal coupling with each of the two adjacent qubits.

In a specific example, the connector includes at least one of: a capacitor, a Josephson junction and a resonance circuit.

It should be noted here that the superconducting circuit structure in the above superconducting quantum chip is similar to the above structure and has the same beneficial effects as the above-mentioned embodiments of the superconducting circuit structure, so it will not be repeated here. For technical details not disclosed in the embodiments of the superconducting quantum chip in the present application, those skilled in the art may understand by referring to the above description of the superconducting structure. To save a space, it will not be repeated here.

A superconducting quantum computer is provided according to an embodiment of the present application, in which at least a superconducting quantum chip and a manipulation and reading device connected to the superconducting quantum chip are provided, wherein at least a superconducting circuit structure is formed on the superconducting quantum chip, and the superconducting circuit structure includes:
  at least two qubits;
  a connector, coupled with the two qubits respectively, to realize transversal coupling with each of the two qubits; and
  a coupler, coupled with the two qubits respectively, to realize longitudinal coupling with each of the two qubits.

In a specific example, the coupler is a resonant cavity, and the resonant cavity includes an adjustable equivalent inductance and a first capacitor connected in parallel with the adjustable equivalent inductance, wherein,
the adjustable equivalent inductance is configured to realize the longitudinal coupling between the coupler and each of the two qubits.

In a specific example, the adjustable equivalent inductance includes a Josephson junction chain, wherein
the Josephson junction chain includes at least two Josephson junctions connected in series, and the Josephson junctions in the Josephson junction chain couple the coupler with each of the two qubits, to realize the longitudinal coupling between the coupler and each of the two qubits.

In a specific example, the qubit includes a superconducting quantum interference device coupled with the coupler, to realize the longitudinal coupling between the coupler and the qubit.

In a specific example, the superconducting quantum interference device includes two Josephson junctions connected in parallel.

In a specific example, the qubit further includes a noise reduction structure configured to perform noise reduction on a charge fluctuation of an environment where the qubit is located.

In a specific example, the qubit further includes a second capacitor connected in parallel with the superconducting quantum interference device, and the second capacitor is configured to perform noise reduction on a charge fluctuation of an environment where the qubit is located.

In a specific example, a qubit network is formed by the superconducting circuit structure including more than two qubits, wherein
  in the qubit network, the connector is configured to realize coupling between two adjacent qubits; and the coupler is provided between the two adjacent qubits coupled by the connector, and configured to realize the longitudinal coupling with each of the two adjacent qubits.

In a specific example, the connector includes at least one of: a capacitor, a Josephson junction and a resonance circuit.

It should be noted here that the superconducting circuit structure in the above superconducting quantum computer is similar to the above structure and has the same beneficial effects as the above-mentioned embodiments of the superconducting circuit structure, so it will not be repeated here. For technical details not disclosed in the embodiments of the superconducting quantum computer in the present application, those skilled in the art may understand by referring to the above description of the superconducting structure. To save a space, it will not be repeated here.

The embodiments above do not constitute a limitation on the protection scope of the present application. It should be understood by those skilled in the art that various modifications, combinations, sub-combinations, and substitutions may be made according to design requirements and other factors. Any modifications, equivalent replacements and improvements made within the spirit and principle of the application shall be encompassed in the protection scope of the application.

What is claimed is:

1. A superconducting circuit structure, comprising:
   at least two qubits;
   a connector, wherein an end of the connector is coupled with one of the two qubits and another end of the connector is coupled with another one of the two qubits, wherein a coupling between the connector and each of the two qubits is transversal coupling; and
   a coupler, wherein an end of the coupler is coupled with the one of the two qubits and another end of the coupler is coupled with the another one of the two qubits, wherein a coupling between the coupler and each of the two qubits is longitudinal coupling;
   wherein each of the two qubits comprises a superconducting quantum interference device coupled with the coupler, and the superconducting quantum interference device comprises two Josephson junctions connected in parallel;
   wherein the connector comprises a capacitor, a Josephson junction, or a resonant circuit;
   wherein the coupler is a resonant cavity, and the resonant cavity comprises an adjustable equivalent inductance and a first capacitor connected in parallel with the adjustable equivalent inductance; and
   wherein the adjustable equivalent inductance comprises a Josephson junction chain, and wherein the Josephson junction chain comprises at least two Josephson junctions connected in series.

2. The superconducting circuit structure according to claim 1, wherein the qubit further comprises a noise reduction structure configured to perform noise reduction on a charge fluctuation of an environment where the qubit is located.

3. The superconducting circuit structure according to claim 1, wherein the qubit further comprises a second capacitor connected in parallel with the superconducting quantum interference device, and the second capacitor is configured to perform noise reduction on a charge fluctuation of an environment where the qubit is located.

4. The superconducting circuit structure according to claim 1, wherein a qubit network is formed by the superconducting circuit structure comprising more than two qubits, and wherein
   in the qubit network, the connector is configured to realize coupling between two adjacent qubits; and the coupler is provided between the two adjacent qubits coupled by the connector, and configured to realize the longitudinal coupling with each of the two adjacent qubits.

5. The superconducting circuit structure according to claim 1, wherein the connector comprises at least one of following components: a capacitor, a Josephson junction and a resonance circuit.

6. A superconducting quantum chip, on which at least a superconducting circuit structure is formed, wherein the superconducting circuit structure comprises:
   at least two qubits;
   a connector, wherein an end of the connector is coupled with one of the two qubits and another end of the connector is coupled with another one of the two qubits, wherein a coupling between the connector and each of the two qubits is transversal coupling; and
   a coupler, wherein an end of the coupler is coupled with the one of the two qubits and another end of the coupler is coupled with the another one of the two qubits, wherein a coupling between the coupler and each of the two qubits is longitudinal coupling;
   wherein each of the two qubits comprises a superconducting quantum interference device coupled with the coupler, and the superconducting quantum interference device comprises two Josephson junctions connected in parallel;
   wherein the connector comprises a capacitor, a Josephson junction, or a resonant circuit;
   wherein the coupler is a resonant cavity, and the resonant cavity comprises an adjustable equivalent inductance and a first capacitor connected in parallel with the adjustable equivalent inductance; and
   wherein the adjustable equivalent inductance comprises a Josephson junction chain, and wherein the Josephson junction chain comprises at least two Josephson junctions connected in series.

7. The superconducting quantum chip according to claim 6, wherein the qubit further comprises a noise reduction structure configured to perform noise reduction on a charge fluctuation of an environment where the qubit is located.

8. The superconducting quantum chip according to claim 6, wherein the qubit further comprises a second capacitor connected in parallel with the superconducting quantum interference device, and the second capacitor is configured to perform noise reduction on a charge fluctuation of an environment where the qubit is located.

9. The superconducting quantum chip according to claim 6, wherein a qubit network is formed by the superconducting circuit structure comprising more than two qubits, and wherein
   in the qubit network, the connector is configured to realize coupling between two adjacent qubits; and the coupler is provided between the two adjacent qubits coupled by the connector, and configured to realize the longitudinal coupling with each of the two adjacent qubits.

10. The superconducting quantum chip according to claim 6, wherein the connector comprises at least one of following components: a capacitor, a Josephson junction and a resonance circuit.

11. A superconducting quantum computer, in which at least a superconducting quantum chip and a manipulation and reading device connected to the superconducting quantum chip are provided, wherein a superconducting circuit structure is formed on the superconducting quantum chip, and the superconducting circuit structure comprises:
   at least two qubits;
   a connector, wherein an end of the connector is coupled with the two qubits and another end of the connector is coupled with another one of the two qubits, wherein a coupling between the connector and each of the two qubits is transversal coupling; and
   a coupler, wherein an end of the coupler is coupled with the one of the two qubits and another end of the coupler is coupled with the another one of the two qubits, wherein a coupling between the coupler and each of the two qubits is longitudinal coupling;
   wherein each of the two qubits comprises a superconducting quantum interference device coupled with the coupler, and the superconducting quantum interference device comprises two Josephson junctions connected in parallel;
   wherein the connector comprises a capacitor, a Josephson junction, or a resonant circuit;
   wherein the coupler is a resonant cavity, and the resonant cavity comprises an adjustable equivalent inductance and a first capacitor connected in parallel with the adjustable equivalent inductance; and
   wherein the adjustable equivalent inductance comprises a Josephson junction chain, and wherein the Josephson junction chain comprises at least two Josephson junctions connected in series.

* * * * *

UNITED STATES PATENT AND TRADEMARK OFFICE
CERTIFICATE OF CORRECTION

PATENT NO. : 11,755,940 B2  
APPLICATION NO. : 17/020527  
DATED : September 12, 2023  
INVENTOR(S) : Lijing Jin et al.

Page 1 of 1

It is certified that error appears in the above-identified patent and that said Letters Patent is hereby corrected as shown below:

On the Title page

In Item (73) Assignee replace:
"BEIJING BAIDU NETCOM
SCIENCE AND TECHNOLOGY
CO., L, Beijing (CN)"

With:
--BEIJING BAIDU NETCOM
SCIENCE AND TECHNOLOGY
CO., LTD., Beijing (CN)--.

Signed and Sealed this  
Fourteenth Day of November, 2023

Katherine Kelly Vidal  
*Director of the United States Patent and Trademark Office*